United States Patent
Chen et al.

(10) Patent No.: US 9,035,264 B2
(45) Date of Patent: May 19, 2015

(54) X-RAY DETECTOR AND HEAT DISSIPATING METHOD

(75) Inventors: Tao Chen, Beijing (CN); Xiaojie Wang, Beijing (CN)

(73) Assignee: GE Medical Systems Global Technology Company, LLC, Waukesha, WI (US)

(*) Notice: Subject to any disclaimer, the term of this patent is extended or adjusted under 35 U.S.C. 154(b) by 232 days.

(21) Appl. No.: 13/601,584

(22) Filed: Aug. 31, 2012

(65) Prior Publication Data

US 2013/0235982 A1 Sep. 12, 2013

(30) Foreign Application Priority Data

Aug. 31, 2011 (CN) .......................... 2011 1 0270204

(51) Int. Cl.
*G01T 7/00* (2006.01)
*A61B 6/00* (2006.01)
*H01L 31/024* (2014.01)

(52) U.S. Cl.
CPC .................. *G01T 7/00* (2013.01); *A61B 6/4488* (2013.01); *H01L 31/024* (2013.01)

(58) Field of Classification Search
CPC ....................................................... H04N 5/32
USPC ......................... 250/370.15, 370.09, 370.08
See application file for complete search history.

(56) References Cited

U.S. PATENT DOCUMENTS

| | | | |
|---|---|---|---|
| 8,901,508 B2* | 12/2014 | Lee et al. ........................ | 250/394 |
| 2007/0272873 A1* | 11/2007 | Jadrich et al. ............. | 250/370.11 |
| 2009/0015981 A1 | 1/2009 | Utschig | |
| 2010/0054404 A1* | 3/2010 | Watanabe ........................ | 378/62 |
| 2010/0243894 A1* | 9/2010 | Kato ........................... | 250/336.1 |
| 2012/0093283 A1* | 4/2012 | Liu et al. .......................... | 378/19 |
| 2012/0104271 A1* | 5/2012 | Gonda ........................... | 250/394 |
| 2012/0168632 A1* | 7/2012 | Yagi et al. ...................... | 250/366 |
| 2013/0083900 A1* | 4/2013 | Kobayashi et al. ............ | 378/189 |

* cited by examiner

*Primary Examiner* — Christine Sung
(74) *Attorney, Agent, or Firm* — GE Global Patent Operation; Marc A. Vivenzio

(57) ABSTRACT

An X-ray detector and a heat dissipating method are provided. The heat dissipating method comprises providing an optical sensing panel over an internal support of the X-ray detector and providing a digital printed circuit board directly on a back cover, so that there is a gap between the digital printed circuit board and the optical sensing panel that is fixed by the internal support. The X-ray detector comprises an optical sensing panel bonded to the outer side of an internal support; and a digital printed circuit board bonded to the inner side of a back cover, wherein there is a gap between the digital printed circuit board and the optical sensing panel that is fixed by the internal support.

4 Claims, 1 Drawing Sheet

X-RAY DETECTOR AND HEAT DISSIPATING METHOD

BACKGROUND OF THE INVENTION

Embodiments of the present invention relate to the field of an X-ray detection apparatus, and in particular to an X-ray detector and a method of heat dissipating.

For a digital X-ray detector, there is always a digital PCB (Printed Circuit Board) inside. An existing structure is typically to provide a digital PCB over an internal support, and an optical sensing panel is provided on the opposite side.

For a digital X-ray detector, an optical sensing panel is a temperature sensitive component, and it is critical that the heat is transferred out of the system package without any impact on the optical sensing panel in terms of the imaging quality and the reliability of the X-ray detector. To isolate the heat transfer between a digital PCB and an optical sensing panel, an existing approach is to provide a dedicated thermal isolator structure therebetween. However, as market trends favor a desire for making X-ray detectors increasingly thinner and lighter, X-ray detectors with dedicated thermal isolator structures are less favorable because they have a larger thickness. An alternative approach is to add metal poles between the back cover and the supporting mechanism of the imaging digital PCB. This approach may block the heat transfer to the optical sensing panel, but ultimately results in a more complicated structure.

Therefore, there is a need for a structure of a novel X-ray detector that may realize the isolation of the heat transfer between a digital PCB and an optical sensing panel without a dedicated thermal isolator structure.

BRIEF DESCRIPTION OF THE INVENTION

In accordance with embodiments disclosed herein, a heat dissipating method for an X-ray detector is provided. The method includes providing an optical sensing panel over an internal support of the X-ray detector and providing a digital printed circuit board directly on a back cover, so that there is a gap between the digital printed circuit board and the optical sensing panel that is fixed by the internal support.

In accordance with embodiments disclosed herein, an X-ray detector is provided. The X-ray detector includes an optical sensing panel, a digital printed circuit board, an internal support, and a back cover, characterized in that the optical sensing panel being bonded to the outer side of the internal support, the digital printed circuit board being bonded to the inner side of the back cover, and there being a gap between the digital printed circuit board and the optical sensing panel that is fixed by the internal support.

DETAILED DESCRIPTION OF THE INVENTION

Figure 1:
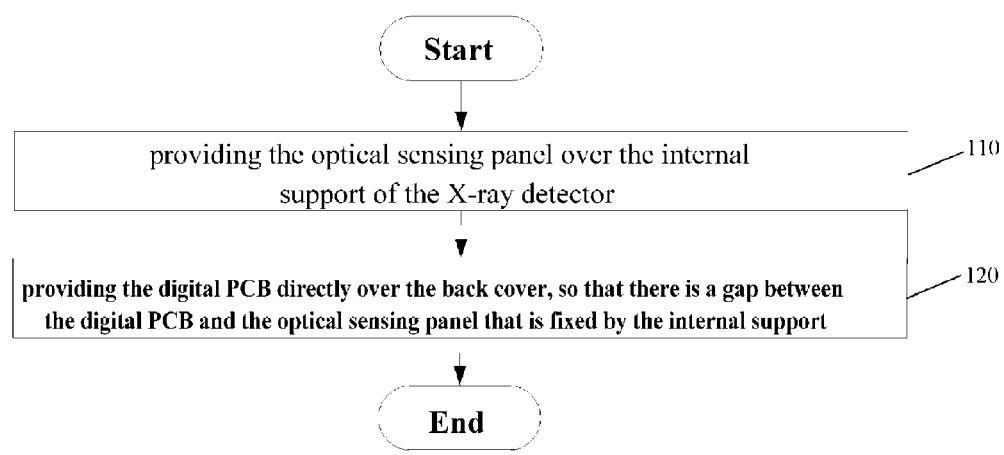
FIG. 1 is a schematic flow diagram illustrating a heat dissipating method for an X-ray detector in accordance with embodiments of the present invention.

Embodiments of the present invention will be further explained below in conjunction with the accompanying drawings and embodiments.

One of the technical problems addressed by embodiments of the present invention is to provide an X-ray detector and a heat dissipating method that will realize the isolation of the heat transfer between the digital PCB and the optical sensing panel without a dedicated thermal isolator.

To address the above-mentioned problems, embodiments of the present invention provide a heat dissipating method for an X-ray detector including providing an optical sensing panel over the internal support of an X-ray detector, placing a digital printed circuit board directly on a back cover, so that there is a gap between the digital printed circuit board and the optical sensing panel that is fixed by an internal support.

Embodiments of the present invention are to further provide an X-ray detector including an optical sensing panel, a digital printed circuit board, an internal support and a back cover, characterized in that the optical sensing panel being bonded to the outer side of the internal support, the digital printed circuit board being bonded to the inner side of the back cover, and there being a gap between the digital printed circuit board and the optical sensing panel that is fixed by the internal support.

Compared to the prior art, the application of embodiments of the present invention will provide the following advantages by fixing the digital PCB directly on the back cover. There is a gap between the digital PCB and the optical sensing panel that is fixed by the internal support. Internal air convection will leverage temperatures of the digital PCB and the optical sensing panel and its support causing them to tend to be the same. Meanwhile, compared to fixing the digital PCB directly on the internal support, the gap of the above-mentioned design has an effect of thermal isolation. By placing the digital PCB directly on the back cover, the digital PCB will use the back cover itself as a heat transferring path for transferring the heat to circumstance directly, thus reducing temperatures of the digital PCB itself and the entire system.

In summary, the method of placing the digital PCB directly on the back cover is a better thermodynamic solution, and realizes the heat dissipation of the system by three manners: heat dissipating via internal air, increasing additional air thermal resistance between the digital PCB and the optical sensing panel, and reducing the thermal resistance between the digital PCB and circumstance.

The solution for placing the digital PCB directly on the back cover will provide the X-ray detector with a better thermodynamic performance, mainly in that the shorter heat transfer path between the digital PCB and circumstance may reduce the temperature inside the detector. The gap between the digital PCB and the optical sensing panel and its support can block heat transfer to the optical sensing panel, and the internal air convection can reduce the impact of the temperature on the optical sensing panel.

As shown in FIG. 1, a heat dissipating method for an X-ray detector according to embodiments of the present invention comprises providing the optical sensing panel over the internal support of the X-ray detector 110 and providing the digital PCB directly over the back cover, so that there is a gap between the digital PCB and the optical sensing panel that is fixed by the internal support, via which the heat transfer from the digital PCB to the optical sensing panel can be blocked, and the internal air convection can reduce the impact of the temperature on the optical sensing panel 120.

The digital PCB is provided directly over the back cover by a heat transferring and insulation unit which may provide heat transfer and electrical insulation. The heat transferring and insulation unit may be formed of heat transferring cushion or silica gel and the like. All materials realizing heat transfer and electrical insulation can utilize the method according to embodiments of the present invention. There is no limitation on materials according to embodiments of the present invention.

The back cover will mainly provide mechanical support and prevent any deformation, and the back cover is a component that is in close contact with circumstance. According to embodiments of the present invention, the digital PCB and the back cover are provided together, thereby implementing the dissipation of heat to circumstance.

The internal support of the X-ray detector may be a stand for the optical sensing panel, which mainly provides a mechanical support.

Figure 2:
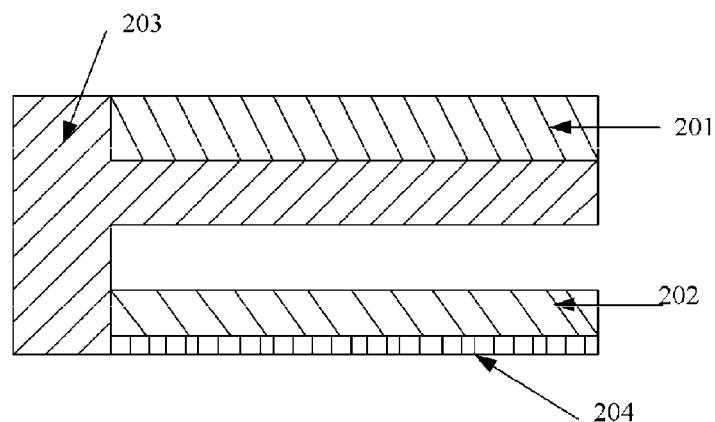
FIG. 2 is a schematic cross-section diagram of an X-ray detector in accordance with embodiments of the present invention.

As shown in FIG. 2, embodiments of the present invention also provide an X-ray detector comprising an optical sensing panel 201, a digital printed circuit board 202, an internal support 203, and a back cover 204. The optical sensing panel is bonded to the outer side of the internal support, the digital printed circuit board is bonded to the inner side of the back cover, and there is a gap between the digital printed circuit board and the optical sensing panel that is fixed by the internal support.

Notably, the bonding of the optical sensing panel to the outer side of the internal support means that the optical sensing panel is generally provided on the outer side of the X-ray detector and used for converting an X-ray signal to an electrical signal, the outer side of the internal support is defined with respect to the interior of the X-ray detector; similarly, the back cover is on the outer side of the X-ray detector and is in close contact with circumstance, and the inner side of the back cover is also defined with respect to the interior of the X-ray detector and is inside the X-ray detector.

The digital printed circuit board is provided directly on the back cover by a heat transferring and insulation unit 205.

Embodiments of the present invention will further be explained below by way of examples.

In the X-ray detector, the optical sensing panel is a key component for converting an X-ray signal to an electrical signal. As the optical sensing panel is a temperature sensitive component, if the temperature of the optical sensing panel is raised by 1° C., the influence on the conversion of the X-ray signal to the electrical signal by the optical sensing panel will be large; therefore, how to transfer the heat out of the system package without any impact on the optical sensing panel will be critical in terms of the imaging quality and the reliability of the X-ray detector. It will be explained below by way of actual tests under conditions where the circumstance temperature is 35° C.

Use of the existing structure: the digital PCB is provided over the internal support, while the optical sensing panel is provided on the opposite side. A thermal test is performed on the optical sensing panel, thereby obtaining a highest temperature of 38.8° C.

Use of the structure according to embodiments of the present invention: the digital PCB is provided directly over the back cover. A thermal test is performed on the optical sensing panel, thereby obtaining the highest temperature of 37.2° C.

It may be seen from above, with a circumstance temperature of 35° C., the optical sensing panel will be raised by 3.8° C. if the existing structure is employed while by only by 2.2° C. if the structure according to embodiments of the present invention is employed, thus reducing the temperature rise by more than 40%.

In summary, providing the PCB directly over the back cover will not only require less change in the entire structure of the X-ray detector, reducing the manufacturing cost, but also the effect of heat dissipating via the back cover is significant, which has strong operation significance.

Described above are embodiments of the present invention, and the claimed scope of embodiments of the present invention are not limited thereto, and it is readily understood by those skilled in the art that changes or substitutions may be made without departing from the claimed scope of embodiments of the present invention. Therefore, the claimed scope of embodiments of the present invention should be defined by the scope of the claims.

What is claimed is:

1. A heat dissipating method for an X-ray detector, the method comprising:
   providing an internal support of the X-ray detector including a substantially planar member and a side member substantially perpendicular to said substantially planar member, said substantially planar member having an inner surface and an outer surface providing an optical sensing panel over the outer surface of said internal support of the X-ray detector;
   affixing a digital printed circuit board directly to a surface of a back cover;
   positioning the back cover adjacent the side member of the internal support such that the digital printed circuit board faces the inner surface of the internal support and there is a gap between the digital printed circuit board and the inner surface of the internal support that is fixed by the internal support, said gap comprising air disposed therein; and
   dissipating heat caused by said digital printed circuit board via the air disposed in said gap.

2. The method of claim 1, wherein the digital printed circuit board is provided directly on the back cover by a heat transferring and insulation unit.

3. An X-ray detector comprising:
   an internal support of the X-ray detector including a substantially planar member and a side member substantially perpendicular to said substantially planar member, said substantially planar member having an inner surface and an outer surface;
   an optical sensing panel bonded to the outer surface of the internal support;
   a back cover including an inner surface and an outer surface; and
   a digital printed circuit board directly bonded to the inner surface of the back cover,
   wherein the back cover is adjacent the side member of the internal support such that the digital printed circuit board faces the inner surface of the internal support and there is a gap between the digital printed circuit board and the inner surface of the internal support that is fixed by the internal support, said gap comprising air disposed therein.

4. The X-ray detector of claim 3, wherein the digital printed circuit board is provided directly on the back cover by a heat transferring and insulation unit.

* * * * *

UNITED STATES PATENT AND TRADEMARK OFFICE
CERTIFICATE OF CORRECTION

| | | |
|---|---|---|
| PATENT NO. | : 9,035,264 B2 | Page 1 of 1 |
| APPLICATION NO. | : 13/601584 | |
| DATED | : May 19, 2015 | |
| INVENTOR(S) | : Chen et al. | |

It is certified that error appears in the above-identified patent and that said Letters Patent is hereby corrected as shown below:

In the specification,

In Column 2, Line 28, delete "support" and insert -- support, --, therefor.

In Column 2, Line 44, delete "hack" and insert -- back --, therefor.

Signed and Sealed this
Tenth Day of November, 2015

Michelle K. Lee
*Director of the United States Patent and Trademark Office*